(12) United States Patent
Amano (10) Patent No.: US 10,862,062 B2
(45) Date of Patent: Dec. 8, 2020

(54) METHOD OF FORMING TRANSPARENT CORRELATED METAL ELECTRODE

(71) Applicant: Konica Minolta Laboratory U.S.A., Inc., San Mateo, CA (US)

(72) Inventor: Jun Amano, Hillsborough, CA (US)

(73) Assignee: Konica Minolta Laboratory U.S.A., Inc., San Mateo, CA (US)

(*) Notice: Subject to any disclaimer, the term of this patent is extended or adjusted under 35 U.S.C. 154(b) by 0 days.

(21) Appl. No.: 16/086,522

(22) PCT Filed: May 22, 2017

(86) PCT No.: PCT/US2017/033830
§ 371 (c)(1),
(2) Date: Sep. 19, 2018

(87) PCT Pub. No.: WO2017/205285
PCT Pub. Date: Nov. 30, 2017

(65) Prior Publication Data
US 2019/0103577 A1    Apr. 4, 2019

Related U.S. Application Data

(60) Provisional application No. 62/340,253, filed on May 23, 2016.

(51) Int. Cl.
*H01L 51/52*    (2006.01)
*H01L 51/00*    (2006.01)
(Continued)

(52) U.S. Cl.
CPC ........ *H01L 51/5203* (2013.01); *C23C 14/088* (2013.01); *C23C 14/58* (2013.01);
(Continued)

(58) Field of Classification Search
CPC ......... H01L 51/0097; H01L 2251/5338; H01L 51/5203; H01L 27/3276; H01L 2251/305
See application file for complete search history.

(56) References Cited

U.S. PATENT DOCUMENTS 6,824,898 B2 * 11/2004 Suzuki .................. C23C 16/409
428/701
RE41,694 E    9/2010 He et al.
(Continued)

FOREIGN PATENT DOCUMENTS

WO    2013/157715 A1    10/2013
WO    2016/019327 A1    2/2016

OTHER PUBLICATIONS

International Preliminary Report on Patentability issued in corresponding International Application No. PCT/US2017/033830 dated Nov. 27, 2018 (8 pages).
(Continued)

*Primary Examiner* — Sonya McCall-Shepard
(74) *Attorney, Agent, or Firm* — Osha Bergman Watanabe & Burton LLP (57) ABSTRACT

A method of fabricating a flexible transparent conductive electrode layer includes depositing a correlated metal film having a thickness between 10 nm and 100 nm on a flexible transparent substrate, annealing the correlated metal film with the UV pulses, and maintaining a temperature of the flexible transparent substrate below 80° C. during the depositing and annealing.

8 Claims, 6 Drawing Sheets

(51) Int. Cl.
*H01L 27/32* (2006.01)
*H01L 51/56* (2006.01)
*C23C 14/58* (2006.01)
*C23C 16/56* (2006.01)
*C23C 16/40* (2006.01)
*C23C 14/08* (2006.01)

(52) U.S. Cl.
CPC ............ *C23C 16/409* (2013.01); *C23C 16/56* (2013.01); *H01L 27/3276* (2013.01); *H01L 51/0097* (2013.01); *H01L 51/56* (2013.01); *H01L 2251/305* (2013.01); *H01L 2251/5338* (2013.01)

(56) References Cited

U.S. PATENT DOCUMENTS

| | | | |
|---|---|---|---|
| 2006/0197092 A1 | 9/2006 | Hoffman et al. | |
| 2008/0213986 A1 | 9/2008 | Kusumoto et al. | |
| 2010/0227477 A1* | 9/2010 | Ito | H01L 51/0003 438/694 |
| 2013/0075377 A1* | 3/2013 | Cheng | C30B 1/02 219/121.85 |
| 2014/0218052 A1 | 8/2014 | Frey et al. | |
| 2015/0056382 A1 | 2/2015 | Suganuma et al. | |
| 2015/0123046 A1* | 5/2015 | Jung | H01B 1/02 252/519.1 |
| 2016/0042829 A1* | 2/2016 | Hu | C23C 14/021 428/216 |

OTHER PUBLICATIONS

International Search Report issued in corresponding International Application No. PCT/US17/33830 dated Aug. 17, 2017 (2 pages).
Written Opinion of the International Searching Authority issued in corresponding International Application No. PCT/US17/33830 dated Aug. 17, 2017 (7 pages).
Zhang, Lei et al. "Correlated metals as transparent conductors", Nature Materials, Published Online: Dec. 14, 2015 | DOI: 10.1038/NMAT4493 (8 pages).
Nakajima, Tomohiko et al., "A universal value of effective annealing time for rapid oxide nucleation and growth under pulsed ultraviolet laser irradiation", Phys.Chem. Chem. Phys., 2013, 15, pp. 14384-14389 (6 pages).

* cited by examiner

METHOD OF FORMING TRANSPARENT CORRELATED METAL ELECTRODE

BACKGROUND

Flexible transparent conductive electrode (TCE) layers are used in a wide variety of applications, for example large-capacity small-screen devices such as cell phones, personal digital assistants (PDAs), digital cameras, and personal-entertainment handhelds. Resistance of TCE layers determines the specific applications of TCE. The thin and flexible nature of flexible transparent conductive electrode layers allows such small-screen devices to be flexible, foldable, or even wearable.

Such devices often require flexible transparent conductive electrode layers of various shapes and/or sheet resistances, depending on the particular applications. However, the range of applications has been limited by the difficulty in forming flexible transparent conductive electrode layers with the desired shapes and sheet resistances.

For example, flexible transparent conductive electrode layers may be used in organic light-emitting diode (OLED) lighting panels, which have a variety of applications; depending on the particular application, the flexible transparent conductive electrode layers may need to be fabricated in a specific shape and/or sheet resistance. Conventional techniques for forming OLED lighting panels use standard deposition of organic semiconductor materials and photolithography, and due to the complex nature of the photolithographic processes in the conventional techniques, there are limited choices of shapes for OLED lighting panels. Consequently, the range of applications of OLED lighting panels is limited. By fabricating desired shape and/or sheet resistance TCE layer and forming OLED layer over the desired shape and/or sheet resistance TCE layer, it is possible to obtain the desired shape OLED light panel for wide range of applications.

SUMMARY OF INVENTION

In general, in one aspect, one or more embodiments of the invention relate to a method of fabricating a flexible transparent conductive electrode layer. The method comprises depositing a correlated metal film having a thickness between 10 nm and 100 nm on a flexible transparent substrate, annealing the correlated metal film with the UV pulses, and maintaining a temperature of the flexible transparent substrate below 80° C. during the depositing and annealing. In some embodiments, the correlated metal film preferably has a thickness between 10 nm and 50 nm.

In another aspect, one or more embodiments relate to a device that includes an annealed, correlated metal film with a thickness between 10 nm and 100 nm on a flexible transparent substrate. In some embodiments, the correlated metal film preferably has a thickness between 10 nm and 50 nm. The correlated metal film is annealed using UV pulses while maintaining a temperature of the flexible transparent substrate below 80° C. The correlated metal film and flexible transparent substrate include a plurality of areas each having different predetermined shapes and different predetermined sheet resistances.

Other aspects of the invention will be apparent from the following description and the appended claims.

BRIEF DESCRIPTION OF DRAWINGS

FIGS. 2A and 2B show schematics of a low temperature vacuum roll-to-roll film deposition process for forming transparent conductive electrodes in accordance with one or more embodiments disclosed herein.

DETAILED DESCRIPTION

Specific embodiments of the invention will now be described in detail with reference to the accompanying figures. Like elements in the various figures are denoted by like reference numerals for consistency. Further, the use of "Fig." in the drawings is equivalent to the use of the term "Figure" in the description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the claimed invention relate to a method of forming (fabricating) a flexible transparent conductive electrode layer using a thin correlated metal film. For example, the method may include irradiating a thin correlated metal film deposited on a flexible transparent substrate with ultraviolet (UV) pulses; depositing a thin correlated metal film on the flexible transparent substrate; and annealing the correlated metal film with UV pulses, all while keeping a temperature of the flexible transparent substrate remains below 80° C. According to one or more embodiments of such a method, the flexible transparent conductive electrode layers may be formed in any arbitrary or desired shapes and/or sheet resistances, which in turn may allow flexible transparent conductive electrode layers to be used in wider applications than conventionally known.

Applications of the flexible transparent conductive electrode layers in accordance with one or more embodiments include, for example, touchscreens, smart windows films, and sensors. Many industrial applications require transparent conductive electrodes of specific shapes and sheet resistances, typically lower than 500Ω/□. For example, sheet resistances for flexible organic light-emitting diode (OLED) displays and solar cells are typically less than 50Ω/□, while sheet resistances for touchscreens are typically in the range of 200-500 Ω/□.

The fabrication method according to one or more embodiments of the invention may be applied to OLED lighting panels. OLED lighting panels may be used to form thin light emitting panels that are flexible and aesthetic, with a wide light emitting area compared to the point source lightings such as LED. Such light emitting panels formed with OLED lighting panels according to one or more embodiments of the invention may have any desired shape and may be used for various applications, such as automobile tail-lights and unique design luminaires.

In one or more embodiments of the invention, flexible OLED lighting panels are formed with flexible transparent conductive electrode layers having any desired shape and/or sheet resistance, without a photolithographic process. As a result, the flexible OLED lighting panels can be fabricated in any suitable shape/sheet resistance for use in, e.g., automobiles, decorative lightings, or various other applications, at reduced cost.

Figure 1:
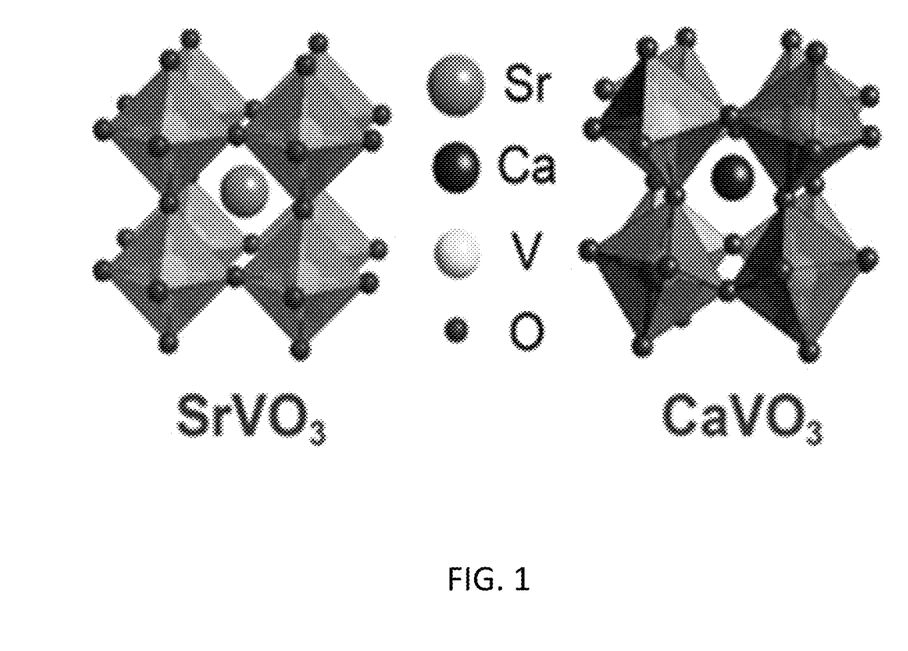
FIG. 1 shows examples of crystal structures of correlated metals, SrVO$_3$ and CaVO$_3$ unit cells in accordance with one or more embodiments disclosed herein.

FIG. 1 demonstrates perovskite crystal structures of correlated metal oxides in the form of $ABO_3$ in accordance with embodiments disclosed herein. For example, $SrVO_3$ and $CaVO_3$ unit cells may be used in the fabrication method in accordance with one or more embodiments of the invention. For $SrVO_3$, A is strontium and B is vanadium. For $CaVO_3$, A is calcium and B is vanadium. $SrVO_3$ has a cubic perovskite structure with a lattice constant c=3.842 Å, whereas $CaVO_3$ is orthorhombically distorted with a lattice constant c=3.770 Å. In the cubic perovskite structure, as in $SrVO_3$, the transition metal vanadium (V) with a partially filled electron shell, occupies the B-site and is surrounded by (and strongly bonded to) 6 oxygen (O) ions, which form an octahedron centered on the B-site. A-site materials include Group IIA materials, such as magnesium (Mg), calcium (Ca), strontium (Sr), and barium (Ba) and combinations of those Group IIA materials. B-site materials include Group VB, materials, such as vanadium (V) and niobium (Nb) and combination of those Group VB materials. One of ordinary skill in the art will appreciate that many transition metal oxides have similar unit cell crystal structures.

Due to the strong Columbic repulsion among highly concentrated electrons in the correlated metals, the electrons move in a correlated manner in relation to the other electrons and the electronic structures are neither simply free-electron like, nor completely ionic, but rather a mixture of both. The resulting electronic structures may exhibit a complex band structure suitable for high transparency in visible wavelength (400-750 nm) with strong UV absorption.

In one or more embodiments of the invention, such correlated metal oxides are utilized to form thin flexible transparent conductive electrode layers in any desired shape and/or resistance. In one or more embodiments of the invention, thin flexible transparent conductive electrode layers of correlated metal oxides are ultra-thin (e.g., 10-100 nm or 10-50 nm). In one or more embodiments, the thin flexible transparent conductive electrode layers are also ultra-smooth. Due to high defect density and low macroscopic crystallinity, namely, no long range alignments of the unit cells, low-temperature deposited correlated metal layers may exhibit sheet resistance on the order of 100 $\Omega/\square$ or higher and transparency higher than 85% in the visible range.

Figure 2A:
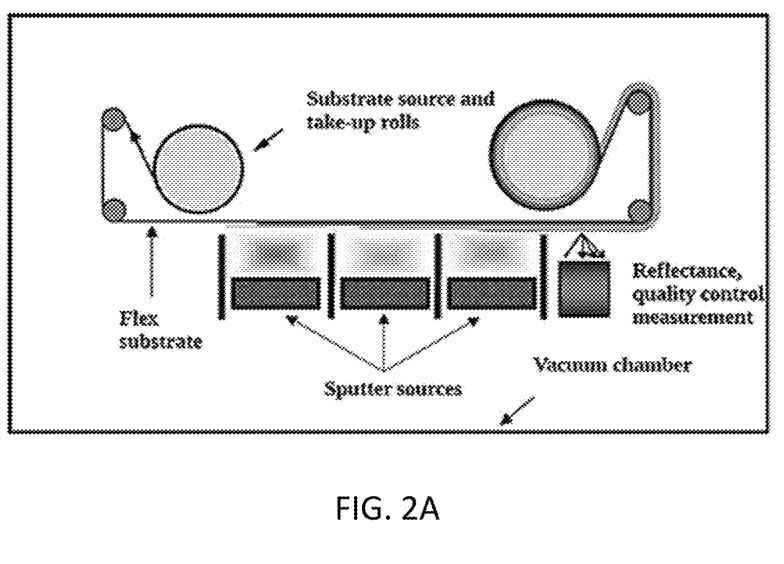
FIG. 2A demonstrates a sputtering roll-to-roll film deposition process in accordance with one or more embodiments disclosed herein.
Figure 2B:
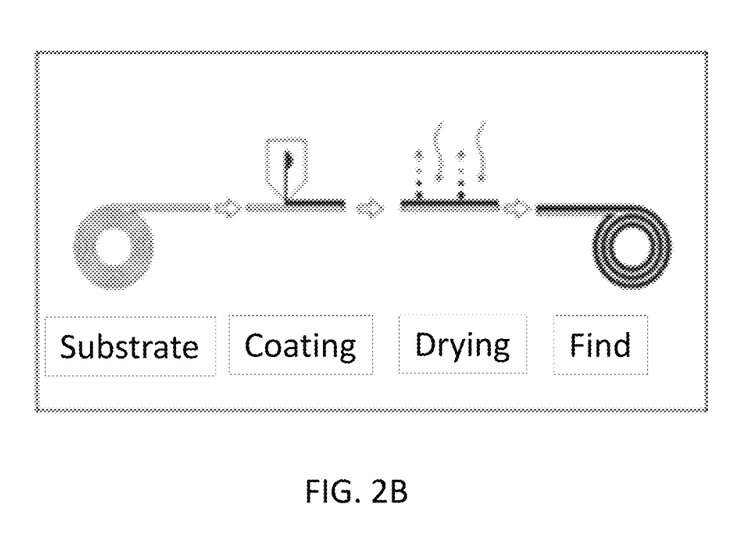
FIG. 2B demonstrates a wet coating roll-to-roll film deposition process in accordance with one or more embodiments disclosed herein.

FIGS. 2A and 2B demonstrate schematics of a low temperature roll-to-roll film deposition process in accordance with one or more embodiments of the invention. The roll-to-roll film deposition process may involve vacuum sputtering and chemical vapor deposition (CVD), as shown in FIG. 2A. The roll-to-roll film deposition process may further involve wet coating, such as "slot die coating," as shown in FIG. 2B, for high uniformity of the thickness of the deposited layer. In one or more embodiments of the invention, a correlated metal film is deposited, by the roll-to-roll film deposition process, onto a flexible transparent substrate. The flexible transparent substrate may consist of any flexible polymers, such as Polyethylene terephthalate (PET) and Polyethylene naphthalate (PEN), and flexible thin glass, such as Corning Willow glass.

In one or more embodiments of the invention, OLED layers may be deposited on the flexible correlated TCE layers for allowing light emission only from areas designed having low sheet resistances, resulting in a desired-shape OLED lighting panel.

Figure 3:
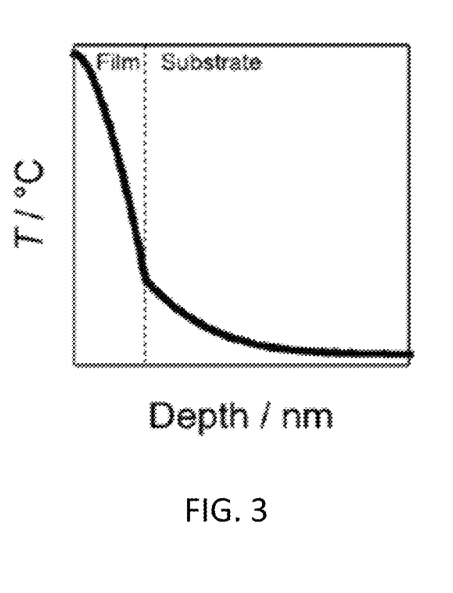
FIG. 3 shows a temperature profile of a flexible transparent substrate in accordance with one or more embodiments disclosed herein.

FIG. 3 shows a temperature of a film under pulsed UV laser irradiation as a function of a width of the film. The temperature of the film rises as power and irradiation duration of the pulsed UV laser increases. In one or more embodiments of the invention, power and/or duration of the UV irradiation required to maintain the temperature of the flexible transparent substrate below 80° C. is determined for the width of the flexible transparent substrate. In this way, power and irradiation duration can be controlled to maintain the temperature of the flexible transparent substrate below 80° C. while producing sufficient high annealing temperature in the correlated metal films. During the UV irradiation induced thermal annealing, macroscopic long range crystalline alignments of the correlated metal unit cells may take place resulting in reduction of sheet resistance to the desired values without damaging underline substrate.

Figure 4:
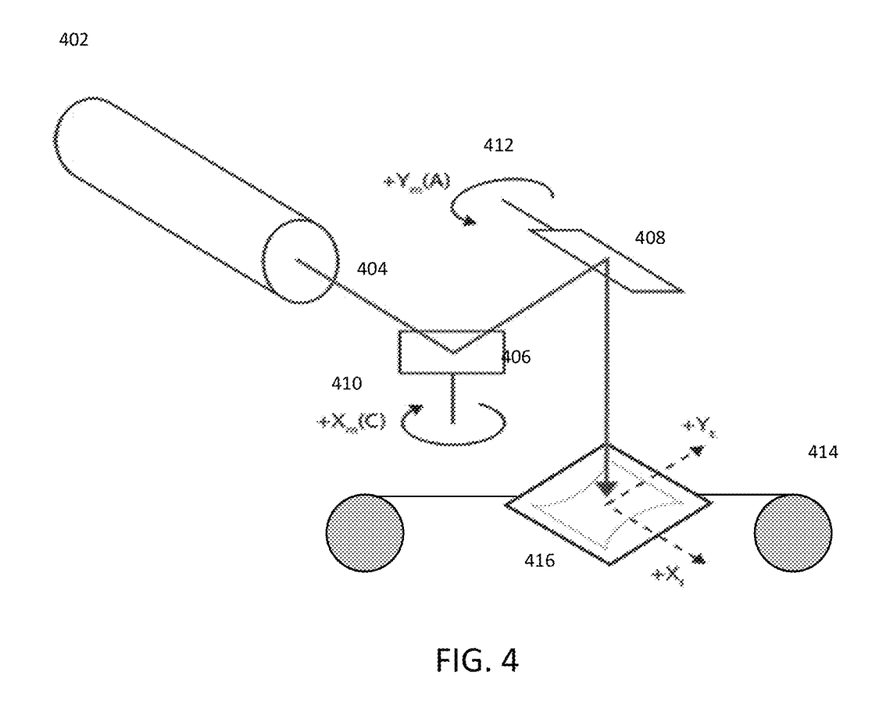
FIG. 4 shows a schematic perspective view of a process for forming flexible transparent conductive electrode layers in accordance with one or more embodiments of the invention.

FIG. 4 shows a schematic of a process of forming a flexible desired-shape transparent conductive electrode in accordance with one or more embodiments of the invention.

In one or more embodiments of the invention, a 2-axis scanning laser annealing system (402) is utilized in the fabrication of flexible transparent conductive electrode layers. In the 2-axis scanning laser annealing system (402), a laser beam (404) may be reflected from two scan mirrors (406 and 408) in turn, and directed through a focusing lens (not shown). The mirrors may deflect, at high speed, the laser beam about a rotation axis (410 or 412). The mirrors may be driven by a galvo-scanner motor. In one or more embodiments of the invention, the roll-to-roll film deposition process (414) involves moving the films and requires only a single-axis scanning laser annealing system (402).

For OLED lighting panel applications, for example, the correlated metal film (416) may be irradiated and annealed by the scanning laser annealing system (402) to form areas with sheet resistance lower than $10\Omega/\square$. For many other applications, the correlated metal film (416) may be irradiated and annealed by the scanning laser annealing system (402) to form areas with low resistance 1 to $100\Omega/\square$. The correlated metal film is crystalized as the film is annealed, resulting in a decrease of the sheet resistance of the film. An area of the correlated metal film that is annealed can be arbitrarily chosen. Further, the sheet resistance of the area of the correlated metal films may be arbitrarily adjusted by adjusting the power and/or annealing duration of the UV laser irradiation.

In one or more embodiments of the invention, a UV laser of sub 300 nm wavelength, which exhibits strong absorption by correlated metal films, is used for annealing correlated metal films. For example, a typical UV Excimer laser (KrF, ArF) is used at fluencies in the range of 10-100 mJ/cm$^2$ with pulse duration of 10-100 nsec may be used.

Figure 5:
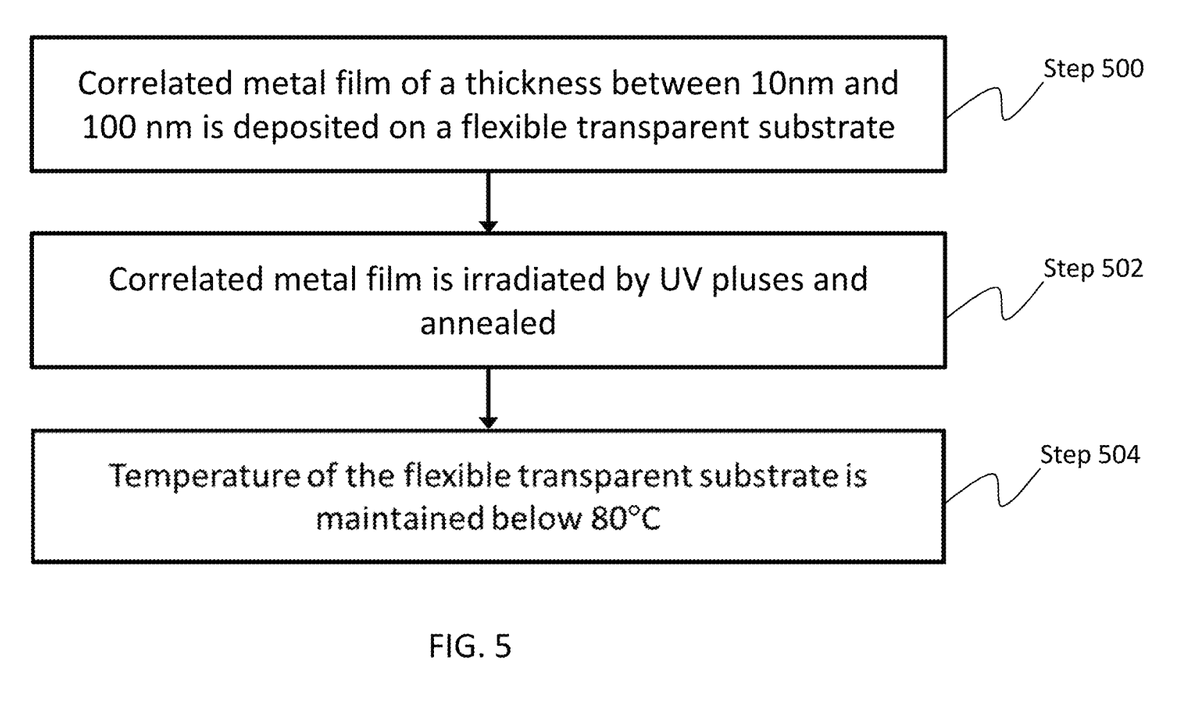
FIG. 5 shows a flow chart in accordance with one or more embodiments of the invention.

FIG. 5 demonstrates a method of fabricating a transparent conductive electrode in accordance with one or more embodiments of the invention.

In Step 500, a correlated metal film of a thickness between 10 nm and 100 nm is deposited on the flexible transparent substrate, for example, by a roll-to-roll deposition process. In some embodiments, the correlated metal film preferably has a thickness between 10 nm and 50 nm. In Step 502, the correlated metal film is annealed by the scanning UV laser annealing system. The power and the annealing duration used in Step 502 may be predetermined based on the intended application of the flexible transparent conductive electrode layer. The power and/or duration of the UV irradiation are adjusted to maintain the temperature of the flexible transparent substrate below 80° C. during Step 504.

The specific power and annealing duration required to obtain the specific sheet resistance suitable for the intended application may be determined according to the crystallization of the film as a function of the power and annealing duration. As the crystallization progresses, the sheet resistance of the film decreases. For example, a predetermined sheet resistance lower than 10 $\Omega/\square$ may be used for OLED lighting panel applications, while 1 to 100$\Omega/\square$ may be used for many other applications. Furthermore, a desired area of the transparent conductive electrode may be selectively annealed to form the area with the desired sheet resistance.

In one or more embodiments of the invention, the transparent conductive electrode includes multiple areas of different shapes and different sheet resistances. Multiple devices, such as OLED lighting panels and touch sensors, may be combined in a single panel using such a transparent conductive electrode.

According to one or more embodiments, flexible transparent conductive electrode layers may be fabricated in any arbitrary shapes/sheet resistance as desired, which allow for a wider range of applications. In one or more embodiments of the invention, the entire fabrication of flexible transparent conductive electrode layers, flexible OLED lighting panels, touch screens and sensor panels of arbitrarily shape and sheet resistance can be achieved by a roll-to-roll process. However, other processes such as a lithographical process may be used without departing from the scope of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of fabricating a flexible transparent conductive electrode layer, comprising:
   depositing a correlated metal film having a thickness between 10 nm and 100 nm on a flexible transparent substrate;
   annealing the correlated metal film with UV pulses; and
   maintaining a temperature of the flexible transparent substrate below 80° C. during the depositing and annealing, wherein
   the annealing comprises annealing a first area of the correlated metal film until the first area has a first predetermined sheet resistance of lower than 10$\Omega/\square$ such that an organic light-emitting diode (OLED) layer can be deposited on the flexible transparent conductive electrode layer without using photolithography, and
   the first area has a first predetermined shape.

2. The method of claim 1,
   wherein the annealing further comprises annealing a second area of the correlated metal film until the second area has a second predetermined sheet resistance, and
   wherein the second area has a second predetermined shape.

3. The method of claim 2, wherein the second predetermined sheet resistance is between 1 and 100 $\Omega/\square$.

4. The method of claim 1, wherein a roll-to-roll deposition process is used for the depositing of the correlated metal film on the flexible transparent substrate.

5. The method of claim 1, wherein the correlated metal film is SrVO$_3$ or CaVO$_3$.

6. The method of claim 1, further comprising:
   depositing the OLED layer on the flexible transparent conductive electrode layer resulting in a flexible organic light-emitting diode lighting panel.

7. The method of claim 1, wherein the correlated metal film has a thickness between 10 nm and 50 nm.

8. The method of claim 1, wherein the correlated metal film is of the form of ABO$_3$ with A being a single or mixture of Group IIA materials and B being a single or mixture of Group VB materials.

* * * * *